(12) United States Patent
Mueller et al.

(10) Patent No.: US 7,671,529 B2
(45) Date of Patent: Mar. 2, 2010

(54) PHOSPHOR CONVERTED LIGHT EMITTING DEVICE

(75) Inventors: Gerd O. Mueller, San Jose, CA (US); Regina B. Mueller-Mach, San Jose, CA (US); Joerg Meyer, Aachen (DE); Peter J. Schmidt, Aachen (DE); Detlef Uwe Wiechert, Alsdorf (DE)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 1319 days.

(21) Appl. No.: 11/008,863

(22) Filed: Dec. 10, 2004

(65) Prior Publication Data

US 2006/0124947 A1  Jun. 15, 2006

(51) Int. Cl.
*C09K 11/08* (2006.01)
(52) U.S. Cl. ............................ 313/503; 252/301.4 F
(58) Field of Classification Search ........... 252/301.4 F; 313/503
See application file for complete search history.

(56) References Cited

U.S. PATENT DOCUMENTS

| 5,847,507 | A | 12/1998 | Butterworth et al. |
| 5,959,316 | A | 9/1999 | Lowery et al. |
| 6,351,069 | B1 | 2/2002 | Lowery et al. |
| 6,417,019 | B1 | 7/2002 | Mueller et al. |
| 6,501,102 | B2 | 12/2002 | Mueller-Mach et al. |
| 6,603,258 | B1 | 8/2003 | Mueller-Mach et al. |
| 6,630,691 | B1 | 10/2003 | Mueller-Mach et al. |
| 6,649,946 | B2 | 11/2003 | Bogner et al. |
| 6,680,569 | B2 | 1/2004 | Mueller-Mach et al. |
| 6,682,207 | B2 | 1/2004 | Webber et al. |
| 6,686,691 | B1 | 2/2004 | Mueller et al. |
| 6,696,703 | B2 | 2/2004 | Mueller-Mach et al. |
| 6,717,353 | B1 | 4/2004 | Mueller et al. |
| 6,740,262 | B2 * | 5/2004 | Oshio .......................... 252/584 |
| 6,956,247 | B1 * | 10/2005 | Stockman ..................... 257/98 |
| 2004/0256974 | A1 * | 12/2004 | Mueller-Mach et al. ..... 313/485 |

FOREIGN PATENT DOCUMENTS

| EP | 1433831 A1 | 6/2004 |
| JP | 2004161806 | * 6/2004 |
| WO | WO 2004/042834 A1 | 5/2004 |

* cited by examiner

*Primary Examiner*—Joseph L Williams
*Assistant Examiner*—Fatima N Farokhrooz
(74) *Attorney, Agent, or Firm*—Patent Law Group (57) ABSTRACT

A semiconductor light emitting device is combined with a wavelength converting material. The semiconductor light emitting device is configured to emit first light of a first peak wavelength. The wavelength converting material is configured to absorb at least a portion of the first light and emit second light of a second peak wavelength. In some embodiments, the first wavelength converting material is $(Ba_{1-x}Sr_x)_{2-y-0.5z}Si_5N_{8-z}O_z:Eu_y^{2+}$ where $0.2<x<0.3$, $(Ba_{1-x}Ca_x)_{2-y-0.5z}Si_5N_{8-z}O_z:Eu_y^{2+}$ where $0.01<x<0.2$, or $M_2Si_{5-a}A_aN_{8-a}O_a:Eu^{2+}$ where M=Sr, Ba, Ca; A=Al, B, Ga, Sc; and $0.01<a<0.2$.

8 Claims, 6 Drawing Sheets

PHOSPHOR CONVERTED LIGHT EMITTING DEVICE

BACKGROUND

1. Field of the Invention

The invention relates generally to wavelength-converted light emitting devices.

2. Description of Related Art

Light emitting devices including light emitting diodes are well known solid state devices that can generate light having a peak wavelength in a specific region of the light spectrum. LEDs are typically used as illuminators, indicators, and displays. LEDs based on the III-nitride materials system have been developed that can efficiently emit light in a relatively narrow band around a peak wavelength in the blue to UV range of the spectrum. Since blue-UV light has a higher photo energy relative to other colors of visible light, such light generated by III-nitride LEDs can be readily converted to produce light having a longer wavelength. It is well known in the art that light having a first peak wavelength ("primary light") can be converted into light having a longer peak wavelength ("secondary light") using a process known as luminescence. The luminescence process involves absorbing the primary light by a photoluminescent phosphor material, which excites the atoms of the phosphor material, and emits the secondary light. The peak wavelength and the band of wavelengths around it (in short wavelength) of the secondary light will depend on the phosphor material. The type of phosphor material can be chosen to yield secondary light having a particular peak wavelength. Needed in the art are wavelength-converting materials such as phosphors that efficiently convert light in desired wavelength ranges and can withstand the operating temperatures of III-nitride light emitting devices.

U.S. Pat. No. 6,649,946 to Bogner et al. describes, in the abstract, "[a] light source [that] uses a yellow to red emitting phosphor with a host lattice of the nitridosilicate type $M_xSi_yN_z$:Eu, wherein M is at least one of an alkaline earth metal chosen from the group Ca, Sr, Ba and wherein $z=\frac{2}{3}x+\frac{4}{3}y$." EP 1 433 831 A1 to Tamaki et al., describes, in the abstract a "nitride phosphor . . . represented by the general formula $L_XM_YN_{((2/3)X+(4/3)Y)}$:R or $L_XM_YO_ZN_{((2/3)X+(4/3)Y-(2/3)Z)}$:R (wherein L is at least one or more selected from the Group II Elements consisting of Mg, Ca, Sr, Ba and Zn, M is at least one or more selected from the Group IV Elements in which Si is essential among C, Si and Ge, and R is at least one or more selected from the rare earth elements in which Eu is essential among Y, La, Ce, Pr, Nd, Sm, Eu, Gd, Th, Dy, Ho, Er and Lu.)"

SUMMARY

Embodiments of the invention include a semiconductor light emitting device combined with a wavelength converting material. The semiconductor light emitting device is configured to emit first light of a peak wavelength. The first wavelength converting material is configured to absorb at least a portion of the first light and emit second light of a second peak wavelength. In some embodiments, the first wavelength converting material is $(Ba_{1-x}Sr_x)_{2-y-0.5z}Si_5N_{8-z}O_z$:$Eu_y^{2+}$ where $0.2<x<0.3$, $(Ba_{1-x}Ca_x)_{2-y-0.5z}Si_5N_{8-z}O_z$:$Eu_y^{2+}$ where $0.01<x<0.2$, or $M_2Si_{5-a}A_aN_{8-a}O_a$:$Eu^{2+}$ where M=Sr, Ba, Ca; A=Al, B, Ga, Sc; and $0.01<a<0.2$.

DETAILED DESCRIPTION

Particularly useful are red- and orange-emitting phosphors. In the materials systems commonly used to make red and orange light emitting diodes, the efficiency of the diodes generally declines as the peak wavelength gets longer, or more red. The efficiency of such devices may further suffer in the temperature extremes experienced in such common applications as traffic lights and automotive lights. In such applications in particular, light emitting diodes that emit blue or UV light that is converted by a red-emitting phosphor may offer superior performance to red light emitting diodes. In addition, red- and orange-emitting phosphors are useful in applications requiring white light, such as illumination and backlighting applications.

Figure 1:
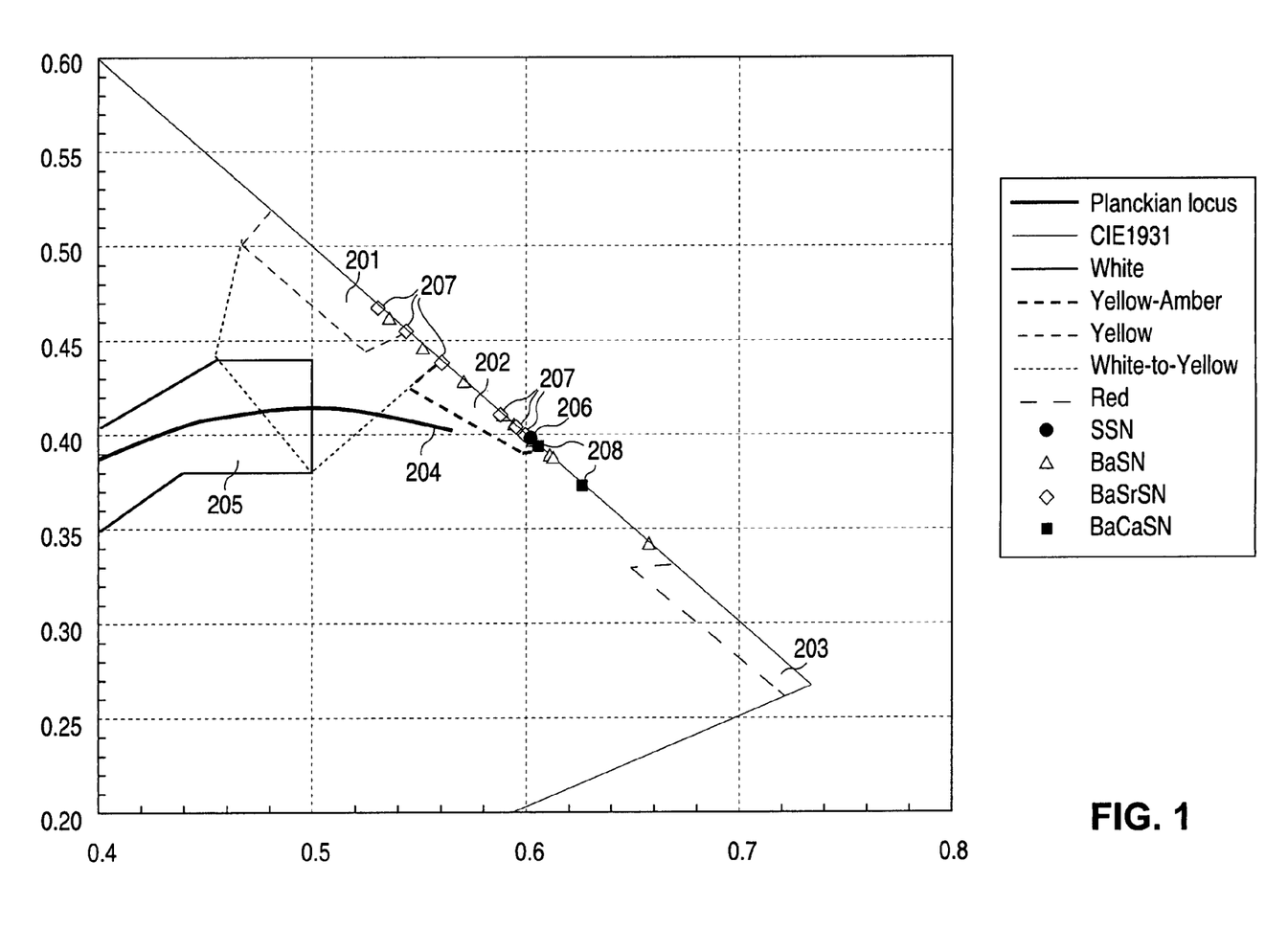
FIG. 1 illustrates a portion of a chromaticity diagram.

In accordance with embodiments of the invention, new orange- and red-emitting phosphors are disclosed that perform well at high temperature and at high illumination from a pump source. Such phosphors may be pumped by, for example, blue or UV light emitting diodes, in systems that emit orange, red, or whitish light and include only the orange- or red-emitting phosphor, or in systems that emit white light and include one or more wavelength-converting materials in addition to the orange- or red-emitting phosphor. FIG. 1 illustrates a portion of a chromaticity diagram. Phosphors in region 201 emit yellow light, phosphors in region 202 emit yellow to amber light, useful for traffic lights and automotive turn-signal lights, and phosphors in region 203 emit red light, useful for traffic lights, automotive tail lights, and as the red component in applications requiring white light, such as backlights. The Planckian locus is illustrated at 204, and white light is illustrated in region 205.

Figure 2:
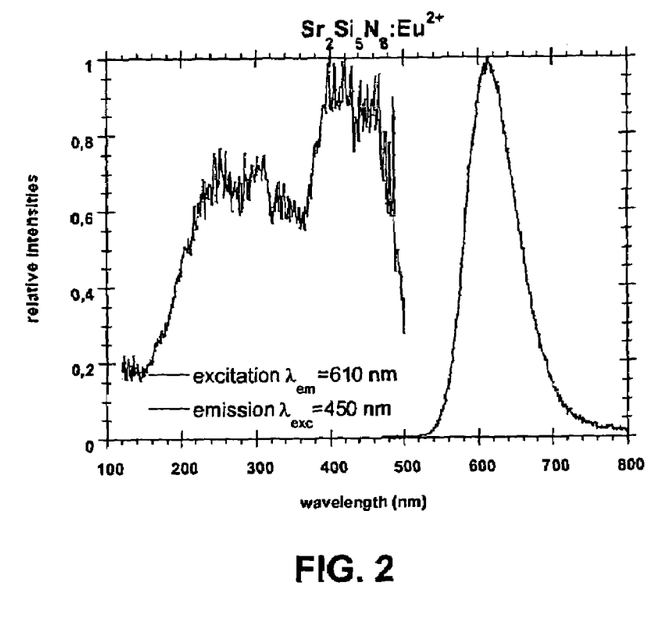
FIG. 2 illustrates the excitation and emission spectra of $Sr_2Si_5N_8$:$Eu^{2+}$.
Figure 3:
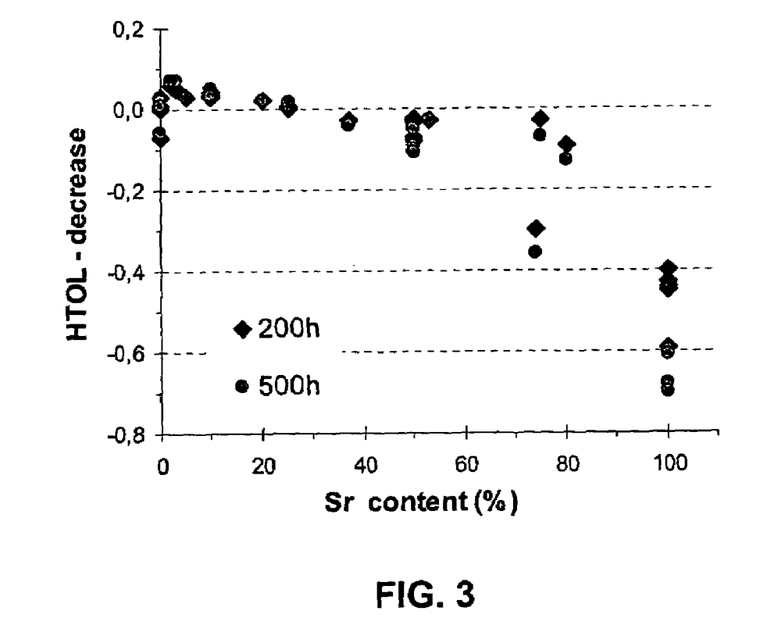
FIG. 3 is a plot of the photo-induced decrease in emission intensity for phosphor converted LEDs including $Sr_2Si_5N_8$:$Eu^{2+}$ and different compositions of $(Ba,Sr)_2Si_5N_8$:$Eu^{2+}$, driven at 350 mA at 85° C. for 200 and 500 hours.

The inventors have discovered that certain formulations of $M_2Si_5N_8$:$Eu^{2+}$ phosphors, where M is one or more of Sr, Ba, and Ca, exhibit poor performance at high temperature or high pump illumination. FIG. 2 illustrates the excitation and emission spectra of $Sr_2Si_5N_8$:$Eu^{2+}$. This formulation, with Sr as the only alkaline earth, has a desirable emission spectrum due to strong emission peak in the red wavelengths. However, the performance of $Sr_2Si_5N_8$:$Eu^{2+}$ degrades significantly with time as the intensity of pump light increases, particularly as the operating temperature increases, as illustrated in FIG. 3. In particular, the inventors have observed that phosphor-converted LEDs including $Sr_2Si_5N_8$:$Eu^{2+}$ (0.75%) run at 350 mA, at 85° C., over 100 and 200 hours, demonstrated a decrease in emission efficiency of 47% and 59%, respectively. A similar device operated at an elevated temperature of 300° C. and illuminated by a similar light power density of 10 W/cm² degraded by 61% within only 12 hours illumination time. The emission of $Sr_2Si_5N_8$:$Eu^{2+}$ is illustrated at point 206 in FIG. 1.

Figure 4:
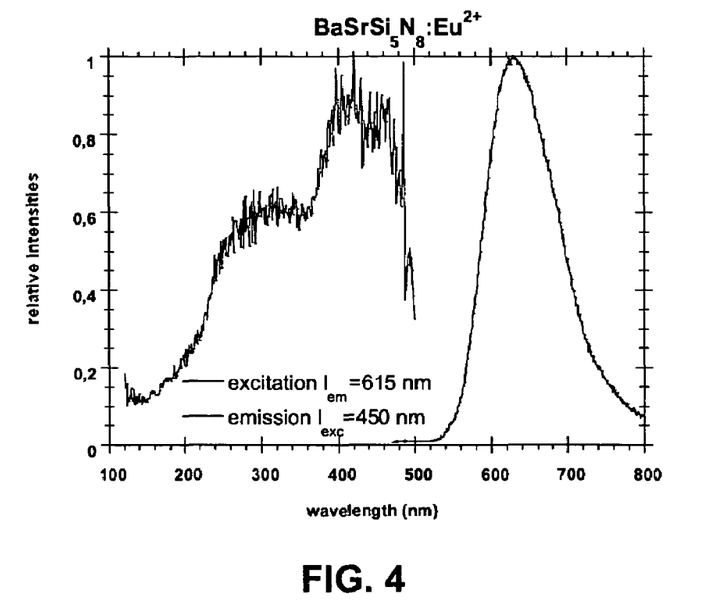
FIG. 4 illustrates the excitation and emission spectra of $(Ba,Sr)_2Si_5N_8$:$Eu^{2+}$.

The addition of Ba, resulting in a phosphor formulation of $(Ba,Sr)_2Si_5N_8:Eu^{2+}$, may increase the performance stability of the phosphor at high temperature and high pump light intensity. FIG. 3 illustrates that as the percentage of Ba in a $(Ba,Sr)_2Si_5N_8:Eu^{2+}$ phosphor increases, the loss of emission efficiency decreases, indicating that adding Ba to the phosphor improves the temperature- and photo-stability of the phosphor. However, as the composition of Ba increases, the emission spectrum peak undesirably shifts toward shorter wavelengths. In some embodiments, acceptable stability and emission spectrum is achieved by a ratio of Ba to Sr greater than 0.75. In particular, favorable stability and emission spectrum are observed in phosphors of the formulation $(Ba_{1-x}Sr_x)_2Si_5N_8:Eu^{2+}$ where $0.2<x<0.3$. FIG. 4 illustrates the excitation and emission spectra of $(Ba,Sr)_2Si_5N_8:Eu^{2+}$. Several formulations of $(Ba,Sr)_2Si_5N_8:Eu^{2+}$ are illustrated at points 207 in FIG. 1.

Figure 5:
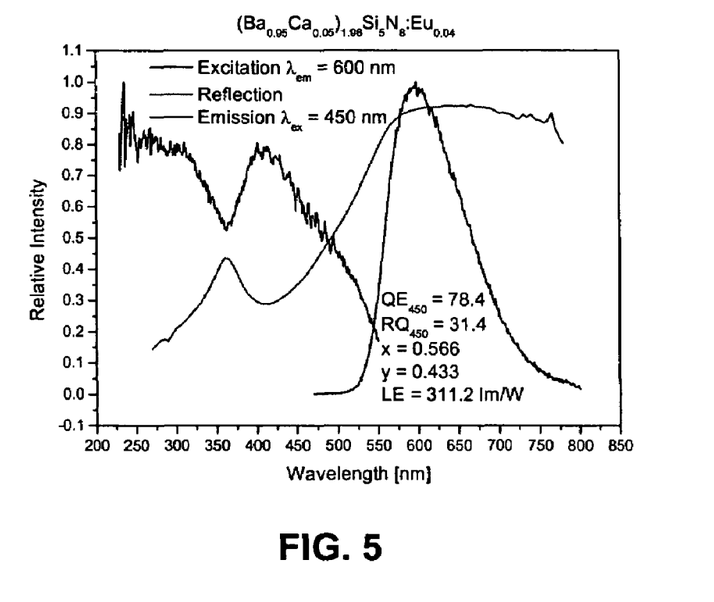
FIG. 5 illustrates the excitation and emission spectra of $(Ba_{0.95}Ca_{0.05})_{1.96}Si_5N_8$:$Eu^{2+}$.
Figure 10:
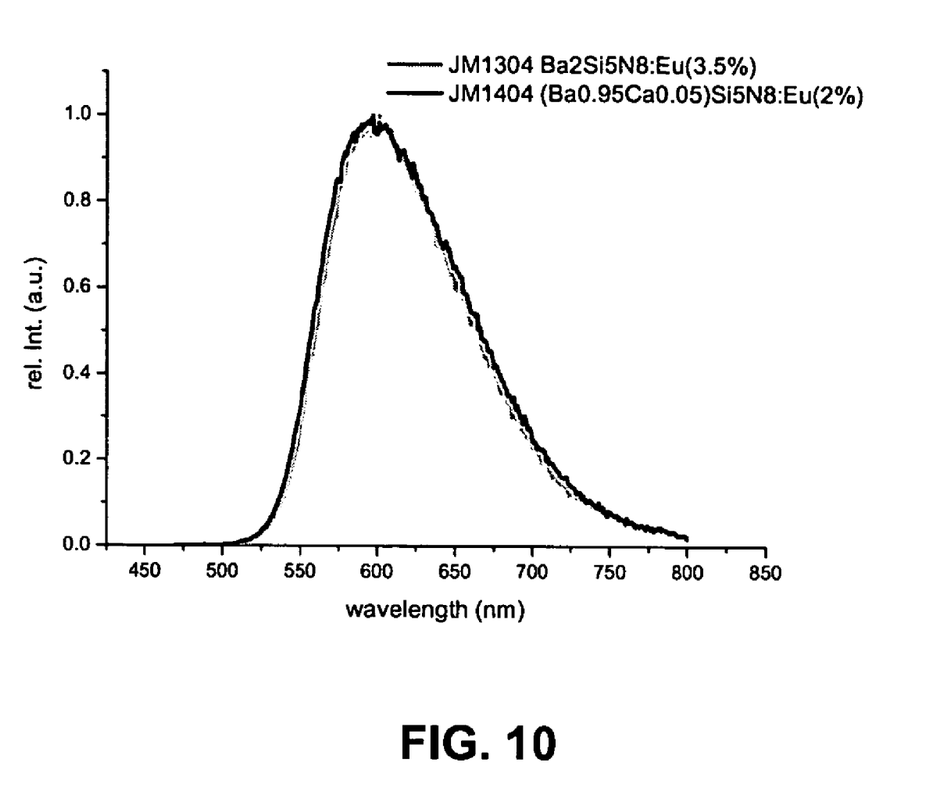
FIG. 10 illustrates the emission spectra of $Ba_2Si_5N_8$:$Eu^{2+}_{0.035}$ and $(Ba_{0.95}Ca_{0.05})_2Si_5N_8$:$Eu^{2+}_{0.02}$.

Substituting Ba and Ca for Sr, resulting in a phosphor formulation of $(Ba,Ca)_2Si_5N_8:Eu^{2+}$, may also increase the performance stability of the phosphor at high temperature and high pump light intensity. Favorable stability and emission spectrum are observed in phosphors of the formulation $(Ba_{1-x}Ca_x)_2Si_5N_8:Eu^{2+}$ where $0.01<x<0.2$. In embodiments including Ca, the composition of Ca may be limited to less than 50%, as Ca compositions greater than 50% may lead to different, undesirable crystal structures. FIG. 10 illustrates the emission spectra of $Ba_2Si_5N_8:Eu^{2+}_{0.035}$ and $(Ba_{0.95}Ca_{0.05})_2Si_5N_8:Eu^{2+}_{0.02}$. The Ba and Ca phosphor has an emission spectrum virtually identical to the Ba phosphor, with a lower concentration of $Eu^{2+}$. Possibly because of the lower concentration of $Eu^{2+}$, the phosphor including 5% Ca shows superior temperature stability than the phosphor without Ca: at 200° C.: $(Ba_{0.95}Ca_{0.05})_2Si_5N_8:Eu^{2+}_{0.02}$ demonstrated 80% efficiency, while $Ba_2Si_5N_8:Eu^{2+}_{0.035}$ demonstrated only 65% efficiency. FIG. 5 illustrates the excitation and emission spectra of $(Ba_{0.95}Ca_{0.05})_{1.96}Si_5N_8:Eu^{2+}_{0.04}$. Two formulations of $(Ba,Ca)_2Si_5N_8:Eu^{2+}$ are illustrated at points 208 in FIG. 1.

Including each of Ba, Ca, and Sr, resulting in a phosphor formulation of $(Ba,Ca,Sr)_2Si_5N_8:Eu^{2+}$, may also increase the performance stability of the phosphor at high temperature and high pump light intensity.

The stability of some of the $M_2Si_5N_8:Eu^{2+}$ phosphors described above may be improved by decreasing the $Eu^{2+}$ doping level. As the $Eu^{2+}$ doping level decreases, the emission spectrum peak undesirably shifts toward shorter wavelengths. Favorable stability and an acceptable emission spectrum under high temperature and high pump light intensity have been observed for $Eu^{2+}$ concentrations between 0.2% and 4%, particularly between 0.75% and 4%.

In some embodiments, during processing, oxygen is unintentionally incorporated into the $M_2Si_5N_8:Eu^{2+}$ phosphors described above. These embodiments are more correctly described by, for example, the formulae $(Ba_{1-x}Ca_x)_{2-y-0.5z}Si_5N_{8-z}O_z:Eu_y^{2+}$ and $(Ba_{1-x}Sr_x)_{2-y-0.5z}Si_5N_{8-z}O_z:Eu_y^{2+}$. These compositions may include up to about 5 atom % oxygen with respect to nitrogen, for which the oxygen substitutes. In some embodiments, $z \leq 0.5$.

Figure 6:
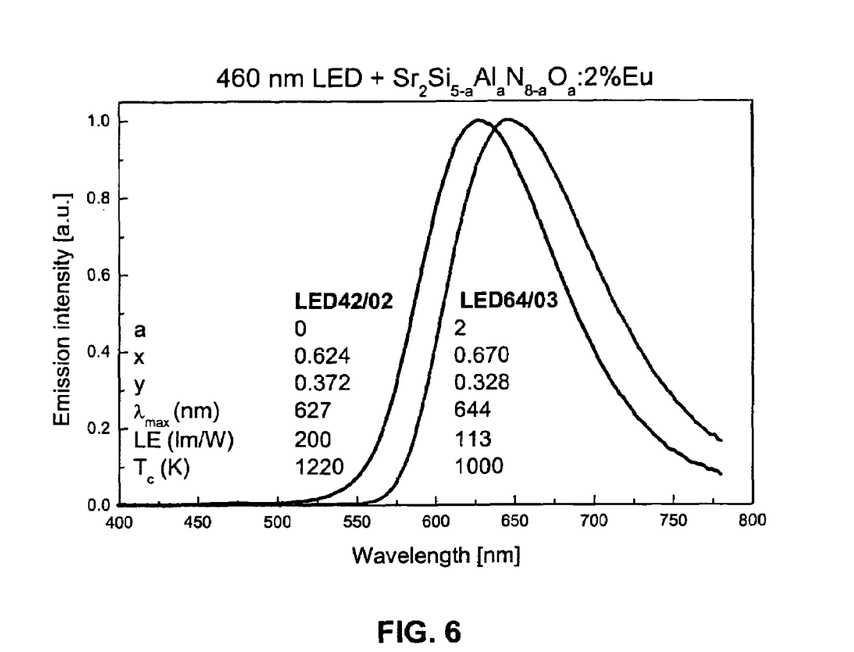
FIG. 6 illustrates the emission spectrum of $(Ba_{0.75}Sr_{0.25})_{1.96}Si_{4.9}Al_{0.1}N_{7.9}O_{0.1}$:$Eu_{0.04}$.
Figure 7:
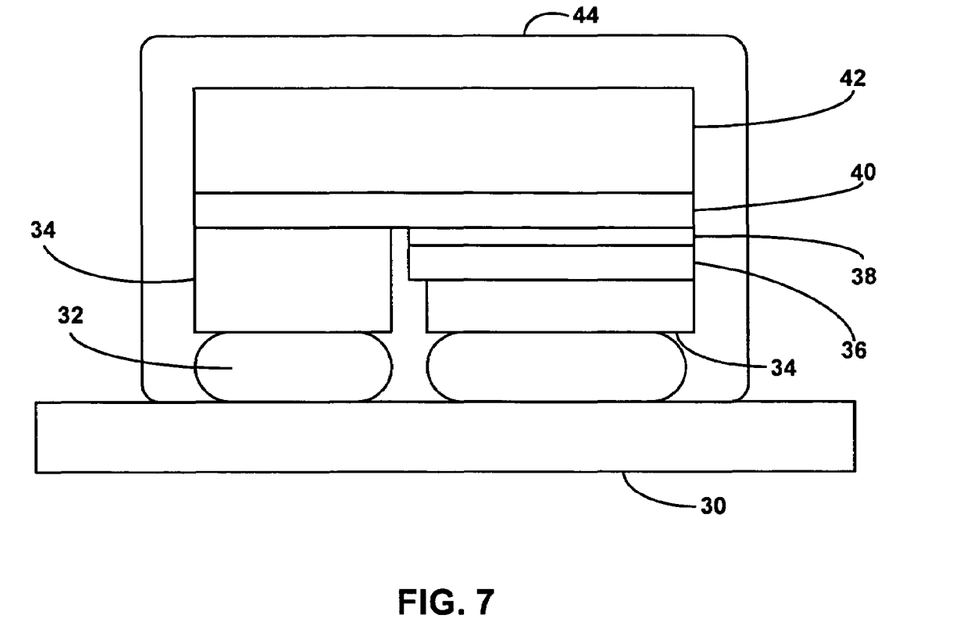
FIGS. 7, 8, and 9 illustrate embodiments of the invention.
Figure 8:
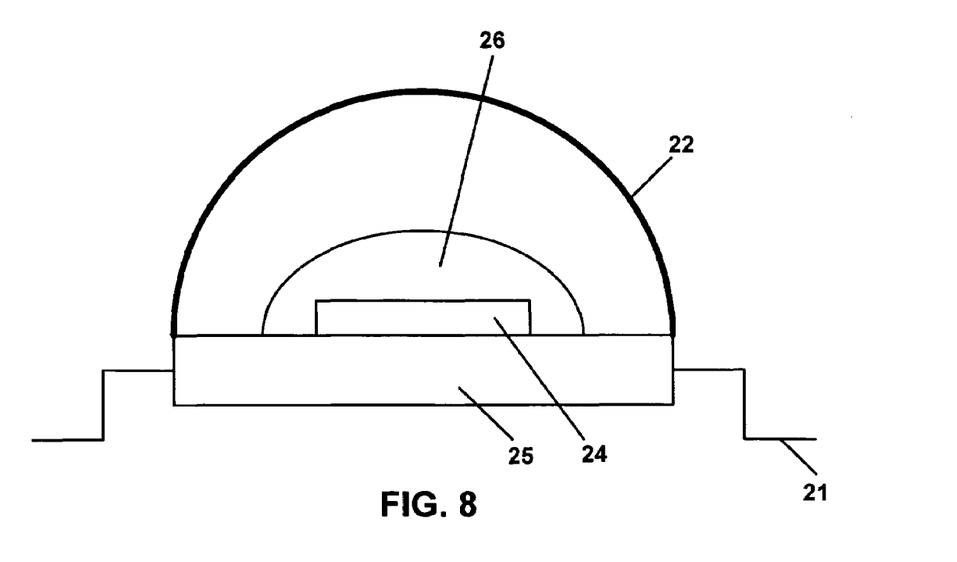
Figure 9:
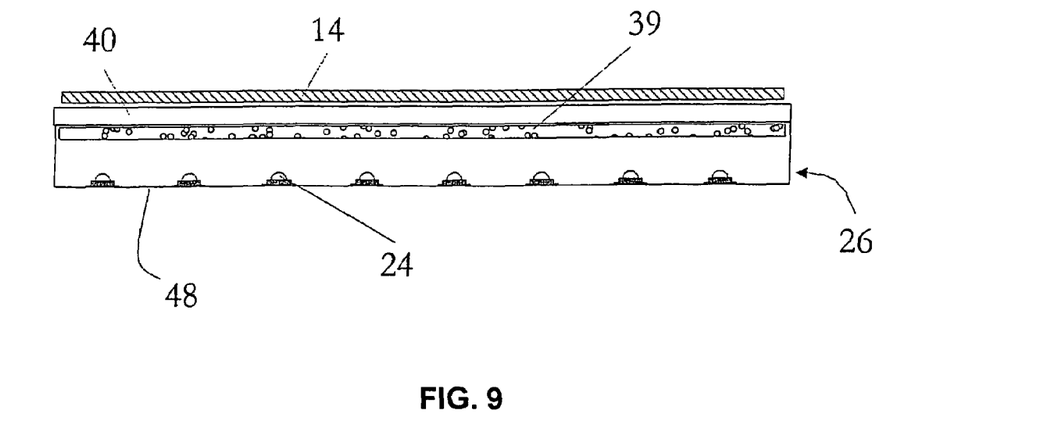

In some embodiments, Al and O are added, resulting in a phosphor formulation of $(Sr_{1-x-y}Ba_xCa_y)_2Si_{5-a}Al_aN_{8-a}O_a:Eu^{2+}$, to improve the stability and spectrum of the phosphor. FIG. 6 illustrates the emission spectra of $Sr_{1.96}Si_5N_8:Eu^{2+}_{0.04}$ and $Sr_{1.96}Si_3Al_2N_6O_2:Eu^{2+}_{0.04}$. The addition of Al and O may broaden the emission spectrum, desirably shifting the emission peak towards more red wavelengths, and may lead to an increased Stokes' shift of the luminescence. Further, oxygen-rich liquid phases that promote particle growth have been observed during synthesis of phosphors including O, resulting in a phosphor with desirable high crystallinity. However, the addition of Al and O may also result in lowering of the thermal quenching temperature. The optimal composition of Al is thus compositions that are great enough to result in a desirable Stokes' shift and crystallinity, but not so great that they significantly lower the thermal quenching temperature of the phosphor. In a preferred embodiment, an optimal range of Al composition is $0.01 \leq a \leq 0.2$. B, Ga, and Sc may substitute for Al, or be added in addition to Al. In a phosphor formulation including O, $O^{2-}$ replaces $N^{3-}$ causing defect states. The addition of Al, B, Ga, and/or Sc compensates for these defect states, resulting in a more stable phosphor. The optimal Al composition range above corresponds to the amount of Al required to compensate for O incorporated into the phosphor during synthesis.

Some of the phosphors described above may be synthesized as follows.

Synthesis of $(Ba_{0.75}Sr_{0.25})_{1.96}Si_{4.9}Al_{0.1}N_{7.9}O_{0.1}:Eu_{0.04}$: 100 g of $Ba_{0.75}Sr_{0.25}O:Eu_{0.02}$ that is prepared by firing a mixture of $BaCO_3$, $SrCO_3$, $Eu_2O_3$ and an equimolar amount of carbon in a stream of forming gas ($H_2/N_2=9/95$) at 1000° C., 61.43 g amorphous silicon nitride (available from Alfa Aesar, 98%), 10.63 g graphite (Alfa Aesar, microcrystal grade), and 0.5 g AlN (Alfa Aesar) are wet mixed with 100 ml isopropanol, dried and homogenized in a dry atmosphere. The precursor mix is poured in a tungsten boat and then fired at 1450° C. in streaming forming gas ($H_2/N_2=9/95$) for 4 hours. The heating rate is 150 k/h up to 1400° C. and 10 k/h up to 1450° C. After cooling down, the phosphor is homogenized by grinding and fired again at 1450° C. for 2 hrs in streaming forming gas ($H_2/N_2=9/95$). The phosphor is then milled with yttria stabilized zirconia balls (2 mm diameter) in isopropanol for 1 hr. The milled phosphor is then subsequently washed with acetic acid, water and ethanol, and finally dried at 100° C.

Synthesis of $(Ba_{0.75}Sr_{0.25})_{1.96}Si_{4.9}B_{0.1}N_{7.9}O_{0.1}:Eu_{0.04}$: 100 g of $Ba_{0.75}Sr_{0.25}O:Eu_{0.02}$ that is prepared by firing a mixture of $BaCO_3$, $SrCO_3$, $Eu_2O_3$ and an equimolar amount of carbon in a stream of forming gas ($H_2/N_2=9/95$) at 1000° C., 61.43 g amorphous silicon nitride (Alfa Aesar, 98%), 10.63 g graphite (Alfa Aesar, microcrystal grade), and 0.88 g α-BN (Riedel de Haen) are wet mixed with 100 ml isopropanol, dried and homogenized in a dry atmosphere. The precursor mix is poured in a tungsten boat and then fired at 1450° C. in streaming forming gas ($H_2/N_29/95$) for 4 hours. The heating rate is 150 k/h up to 1400° C. and 10 k/h up to 1450° C. After cooling down the phosphor is homogenized by grinding and fired again at 1450° C. for 2 hrs in streaming forming gas ($H_2/N_2=9/95$). The phosphor is then milled with yttria stabilized zirconia balls (2 mm diameter) in isopropanol for 1 hr. The milled phosphor is then subsequently washed with acetic acid, water and ethanol, and finally dried at 100° C.

Synthesis of $(Ba_{0.95}Ca_{0.05})_{1.96}Si_5N_8:Eu_{0.04}$: $(Ba_{0.95}Ca_{0.05})_{1.96}Si_5N_8:Eu_{0.04}$ is synthesized using $Ba_3N_2$, which is obtained by nitridation of Ba metal (Aldrich, St. Louis, Mo., USA) at 700° C. in $N_2$ atmosphere, $Ca_3N_2$ (Alfa Aesar, Karlsruhe, Germany), amorphous $Si_3N_4$ (98%, Alfa Aesar) and $EuF_3$ (Aldrich). In a glove box 42.09 g $Ba_3N_2$, 0.763 g $Ca_3N_2$, 27.22 g SiN and 1.290 g $EuF_3$ are mixed in a porcelain mortar. The mixture is fired at 1400° C. in streaming forming gas ($H_2/N_2=9/95$) for 4 h in a tungsten crucible, reground and fired a second time. The resulting orange colored powder is washed with acetic acid, water and 2-propanol removing unreacted components and fine particles.

The phosphors described above may offer several advantages. They may be more stable than conventional $Sr_2Si_5N_8:Eu^{2+}$ when operated at high temperature and/or high pump light intensity. For many of the above phosphors, any change in the spectrum caused by elevated temperature or pump light intensity is reversible, indicating that the color of light emitted by the phosphor is not expected to change significantly with use over time. Such phosphors are particularly useful for applications requiring precision in the color emitted by the phosphor, such as backlighting applications. In addition, many of the above phosphors have a wider excitation spectrum than conventional phosphors such as $Y_3Al_5O_{12}$:Ce. For example, some of the phosphors described above have an excitation spectrum that extends to wavelengths shorter than 410 nm. Using a 410 nm device as a pump may be beneficial, particularly for applications requiring red or orange light, since at 410 nm, any light leaking through the phosphor layer will not change the color appearance of the composite light, and does not need to be completely removed from the spectrum, for example by complete absorption by the phosphor or by a filter, since light at 410 nm is not subject to many safety regulations governing leakage of UV light.

FIG. 4 illustrates a first example of a device incorporating one or more of the phosphors described above. Phosphor layer 44, which may include one or more phosphors, covers a light emitting diode including an n-type region 40, and active region 38, and a p-type region 36 formed over a substrate 42. Contacts 34 are formed on the n- and p-type regions, then the light emitting diode is flipped over and electrically and physically connected to a submount 30 by interconnects 32. The light emitting device need not be a flip chip and may be oriented such that light is extracted from the device through the semiconductor device layers, rather than through the substrate.

The one or more phosphors in phosphor layer 44 may be deposited as thin films by, for example, electron beam evaporation, thermal evaporation, rf-sputtering, chemical vapor deposition, or atomic layer epitaxy; or deposited as conformal layers over LED 1 by, for example, screen printing, stenciling as described in U.S. Pat. No. 6,650,044, or by electrophoretic deposition as described in U.S. Pat. No. 6,576,488. Thin films are described in more detail in U.S. Pat. No. 6,696,703. Each of U.S. Pat. No. 6,696,703, U.S. Pat. No. 6,650,044 and U.S. Pat. No. 6,576,488 are incorporated herein by reference. In contrast to a thin film, which typically behaves as a single, large phosphor particle, the phosphor in a conformal layer generally behaves as multiple phosphor particles. In addition a thin film typically contains no materials other than phosphor. A conformal layer often includes materials other than phosphor, such as, for example, silica.

FIG. 5 illustrates a second example of a device incorporating one or more of the phosphors described above. The device of FIG. 5 is a packaged light emitting diode including a light emitting diode 24 optionally mounted on a submount (not shown), supported by a base 25, and electrically connected to leads 21. A lens 22 protects light emitting diode 24. The phosphor may be dispersed in an encapsulant material 26 that is injected in a space between lens 22 and light emitting diode 24. The encapsulant may be, for example, silicone, epoxy, or any other organic or inorganic material which is suitable for incorporating the phosphor(s).

FIG. 6 illustrates a third example of a device incorporating one or more of the phosphors described above, a display device with phosphors spaced apart from one or more LEDs. The device illustrated in FIG. 6 is described in more detail in application Ser. No. 10/678,541, filed Oct. 3, 2003, titled "LCD Backlight Using Two-Dimensional Array LEDs," and incorporated herein by reference.

FIG. 6 is a side view of an LCD display. An array of LEDs 24 is placed on the rear panel of the backlight 26. The backlight 26 is covered with a diffusing cover plate 40. The diffuser 40 is for example made of acrylic or glass, with a roughened surface for diffusing light. Alternatively, the diffuser 40 may have light scattering particles with the acrylic or glass sheet. Many types of diffusers are known and may be used with the backlight 26. A transparent plate may be used instead of the diffuser 40 if the light output of the backlight 26 is sufficiently diffuse without a diffuser. Additional films (not shown) for increasing the brightness or efficiency might be used on top of the diffuser, just before the LCD, as for example Brightness Enhancement Film and Dual Brightness Enhancement Film, as for example produced by 3M.

The back plane and the sidewalls of the backlight 26 are covered with highly reflective materials. Good results have been obtained with a white diffuse reflective film on the back (e.g., E60L, produced by Toray, Japan), and a specular reflecting material on the sidewalls (e.g., Miro material, as produced by Alanod, Germany), but other configurations work as well. The materials used should have a high coefficient of reflection, preferably >90%. By using these high reflective materials, a high recycling efficiency is achieved. This is in particular important when Brightness Enhancement Films are used, as mentioned above, as these films reflect the light which can not be used in the first pass, and which needs to be recycled in order to contribute to the output of the LCD during a second or third pass.

LCD panel 14 is placed in front of the backlight 26. The LCD panel 14 may be a conventional LCD, having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 14 and the backlight 26, additional films can be used, such as a brightness enhancement film (BEF) or polarization recovery film (DBEF).

LEDs 26 are generally blue or UV-emitting LEDS. A phosphor layer 39, which may include one or more of the phosphors described above, is formed on the cover plate 40, rather than directly on LEDs 26. In some embodiments, different phosphor layers are formed on different surfaces of cover plate 40. The cover plate 40 may or may not be a diffuser, depending on the amount of diffusing performed by the phosphor. Spacing phosphor layer 39 apart from LEDs 26 is attractive because light emitted from the phosphor to the rear of the backlight 26 has a larger recycling efficiency than into the LED chips, due to the high reflectivity of the films used in the backlight 26. In addition to the recycling efficiency, the phosphors are not required to withstand the high temperatures near the LEDs and are not required to be chemically compatible with the LEDs, increasing the number of possible suitable phosphors and potentially improving the efficiency and lifetime of the device. From a logistics point of view, this solution is attractive as well, as the blue backlight can be used for a large range of different displays, with different types of color filters, and only the phosphor layer thickness and phosphor concentration has to be optimized to fit a particular LCD.

In some embodiments of the devices illustrated in FIGS. 4, 5 and 6, one of the phosphors described above is included in the device as the only wavelength-converting material. The amount of unconverted light from the light emitting diode mixing with the light emitted by the phosphor is determined by the characteristics, such as thickness and amount of phosphor, of the layer containing the phosphor. For example, a blue-emitting device may include a yellow-emitting phosphor layer configured to permit a sufficient amount of blue light to leak through the phosphor such that the combined blue light from the device and yellow light from the phosphor appears whitish. Or, a blue- or UV-emitting device may include a single phosphor layer configured such that little or no unconverted light escapes the phosphor layer, and the combined light is the same color as light emitted by the phosphor. In some embodiments, a filter material such as a dye may be incorporated into the device for filtering out some wavelengths of light, for example, any pump light unconverted by the phosphor. The use of a filter material is described in more detail in application Ser. No. 10/260,090, titled "Selective Filtering of Wavelength-Converted Semiconductor Light Emitting Devices," filed Sep. 27, 2002, and incorporated herein by reference. Filters may be used, for example, to filter out unconverted UV light in a device with a UV pump, or to filter out shorter wavelengths to make phosphor-converted light appear more red.

In some embodiments of the devices illustrated in FIGS. 4, 5 and 6, one of the phosphors described above is combined with other wavelength converting materials. For example, a blue light emitting diode may be combined with a yellow- or green-emitting phosphor and a red-emitting phosphor. Examples of other suitable yellow- or green-emitting phosphors include $(Lu_{1-x-y-a-b}Y_xGd_y)_3(Al_{1-z}Ga_z)_5O_{12}:Ce_a^{3+}Pr_b^{3+}$ wherein $0<x<1$, $0<y<1$, $0<z\leq0.1$, $0<a\leq0.2$ and $0<b\leq0.1$ including, for example, $Lu_3Al_5O_{12}:Ce^{3+}$ and $Y_3Al_5O_{12}:Ce^{3+}$; $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_{y-}In_zS_4):Eu^{2+}$ including, for example, $SrGa_2S_4:Eu^{2+}$; and $(Sr_{1-x}Ba_x)_2SiO_4:Eu^{2+}$. Examples of other suitable red-emitting phosphors include $(Ca_{1-x}Sr_x)S:Eu^{2+}$ wherein $0<x\leq1$ including, for example, $CaS:Eu^{2+}$ and $SrS:Eu^{2+}$; and $(Lu_{1-x}Ln_x)_2S_3:Ce^{3+}$ wherein Ln may be chosen from the group Y, Lu, Gd, Sc including, for example $Lu_2S_3:Ce^{3+}$.

In another example, a UV light emitting diode may be combined with a blue-emitting phosphor, a yellow- or green-emitting phosphor and a red-emitting phosphor. Examples of suitable yellow- or green-emitting phosphors and suitable red-emitting phosphors are listed above. Examples of suitable blue-emitting phosphors include, for example, $MgSrSiO_4:Eu^{2+}$; $(Sr_{1-x-y}Ca_xBa_y)_3MgSi_2O_8:Eu^{2+}$ including, for example $Ba_3MgSi_2O_8:Eu^{2+}$; and $BaMgAl_{10}O_{17}:Eu^{2+}$.

In devices with more than one phosphor, the individual phosphors may be mixed together and applied as a mixture, or separated into discrete layers or discrete regions.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:
a semiconductor light emitting device configured to emit first light of a first peak wavelength; and
a first wavelength converting material comprising $(Ba_{1-x}Sr_x)_{2-y-0.5z}Si_5N_{8-z}O_z:Eu_y^{2+}$ where $0.2<x<0.3$, $0.002\leq y\leq0.04$, and $z\leq0.5$, the first wavelength converting material being configured to absorb at least a portion of the first light and emit second light of a second peak wavelength.

2. The structure of claim 1 further comprising a second wavelength converting material configured to absorb at least a portion of the first or second light and emit third light of a third peak wavelength.

3. The structure of claim 1 wherein a concentration of $Eu^{2+}$ in the first wavelength converting material is between 0.2% and 4%.

4. The structure of claim 2 wherein the second wavelength converting material comprises one of $(Lu_{1-x-y-a-b}Y_xGd_y)_3(Al_{1-z}Ga_z)_5O_{12}:Ce_a^{3+}Pr_b^{3+}$ wherein $0<x<1$, $0<y<1$, $0<z\leq0.1$, $0<a\leq0.2$ and $0<b\leq0.1$, $Lu_3Al_5O_{12}:Ce^{3+}$, $Y_3Al_5O_{12}:Ce^{3-}$, $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5), $SrSi_2N_2O_2:Eu^{2+}$, $(Sr_{1-u-v-x}Mg_uCa_vBa_x)(Ga_{2-y-z}Al_{y-}In_zS_4):Eu^{2+}$, $(SrGa_2S_4:Eu^{2+}$, and $(Sr_{1-x}Ba_x)_2SiO_4:Eu^{2+}$.

5. The structure of claim 2 wherein the structure emits composite light comprising first light, second light, and third light, that appears white.

6. The structure of claim 2 further comprising a third wavelength converting material configured to absorb at least a portion of the first, second, or third light and emit fourth light of a fourth peak wavelength.

7. The structure of claim 6 wherein the third wavelength converting material comprises one of $MgSrSiO_4:Eu^{2+}$; $(Sr_{1-x-y}Ca_xBa_y)_3MgSi_2O_8:Eu^{2+}$; $Ba_3MgSi_2O_8:Eu^{2+}$; and $BaMgAl_{10}O_{17}:Eu^{2+}$.

8. The structure of claim 6 wherein the structure emits composite light comprising first light, second light, third light, and fourth light, that appears white.

* * * * *